(12) United States Patent
Matsuo et al.

(10) Patent No.: US 10,403,642 B2
(45) Date of Patent: Sep. 3, 2019

(54) SEMICONDUCTOR DEVICE

(71) Applicant: TOSHIBA MEMORY CORPORATION, Minato-ku (JP)

(72) Inventors: Kazuhiro Matsuo, Kuwana (JP); Akiko Sekihara, Yokkaichi (JP); Akira Takashima, Kuwana (JP); Tomonori Aoyama, Yokkaichi (JP); Tatsunori Isogai, Yokkaichi (JP); Masaki Noguchi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/056,941

(22) Filed: Aug. 7, 2018

(65) Prior Publication Data

US 2019/0139981 A1    May 9, 2019

(30) Foreign Application Priority Data

Nov. 8, 2017   (JP) .................. 2017-215654

(51) Int. Cl.
*H01L 29/792* (2006.01)
*H01L 27/11582* (2017.01)
*H01L 29/51* (2006.01)

(52) U.S. Cl.
CPC ...... *H01L 27/11582* (2013.01); *H01L 29/518* (2013.01)

(58) Field of Classification Search
CPC .......................... H01L 27/11582; H01L 29/518

USPC .................................................. 257/324, 321
See application file for complete search history.

(56) References Cited

U.S. PATENT DOCUMENTS

| | | | |
|---|---|---|---|
| 7,602,012 B2 | 10/2009 | Hashimoto | |
| 8,940,645 B2 | 1/2015 | Ramkumar et al. | |
| 2014/0367763 A1 | 12/2014 | Yasuda | |
| 2016/0064409 A1 | 3/2016 | Yaegashi | |
| 2017/0062456 A1* | 3/2017 | Sugino | H01L 27/11582 |

FOREIGN PATENT DOCUMENTS

| | | |
|---|---|---|
| JP | 2005-184028 | 7/2005 |
| JP | 2007-250582 | 9/2007 |
| JP | 2008-78376 | 4/2008 |
| JP | 2015-2195 | 1/2015 |

* cited by examiner

*Primary Examiner* — Tan N Tran
(74) *Attorney, Agent, or Firm* — Oblon, McClelland, Maier & Neustadt, L.L.P.

(57) ABSTRACT

A semiconductor device includes a semiconductor layer, a first conductive layer, a tunneling insulating film, and a charge trapping film. The tunneling insulating film is provided between the semiconductor layer and the first conductive layer. The charge trapping film is provided between the first conductive layer and the tunneling insulating film. The charge trapping film includes a first separation layer, a first trapping layer, and a second trapping layer. The first trapping layer is positioned between the tunneling insulating film and the first separation layer. The second trapping layer is positioned between the first conductive layer and the first separation layer. A trapping efficiency of charge in the first trapping layer is higher than a trapping efficiency of charge in the second trapping layer.

20 Claims, 12 Drawing Sheets

SEMICONDUCTOR DEVICE

CROSS-REFERENCE TO RELATED APPLICATIONS

This application is based upon and claims the benefit of priority from Japanese Patent Application No. 2017-215654, filed on Nov. 8, 2017; the entire contents of which are incorporated herein by reference.

FIELD

Embodiments relate to a semiconductor device.

BACKGROUND

Nonvolatile memory is known in which insulating layers and conductive layers are stacked alternately in a stacked body, and memory cells are stacked in a three-dimensional structure in the height direction of the stacked body. The conductive layers inside the stacked body are, for example, word lines. Semiconductor layers that are used to form channels are provided inside the memory holes extending in the height direction of the stacked body. Charge trapping portions are provided at the intersection portions between the word lines and the channels; and a memory cell that includes the channel/charge trapping portion/word line is obtained at each of the intersection portions. The data retention characteristics of the memory cell degrade as the memory cell is downscaled. It is desirable to improve the data retention characteristics.

DETAILED DESCRIPTION

Figure 1:
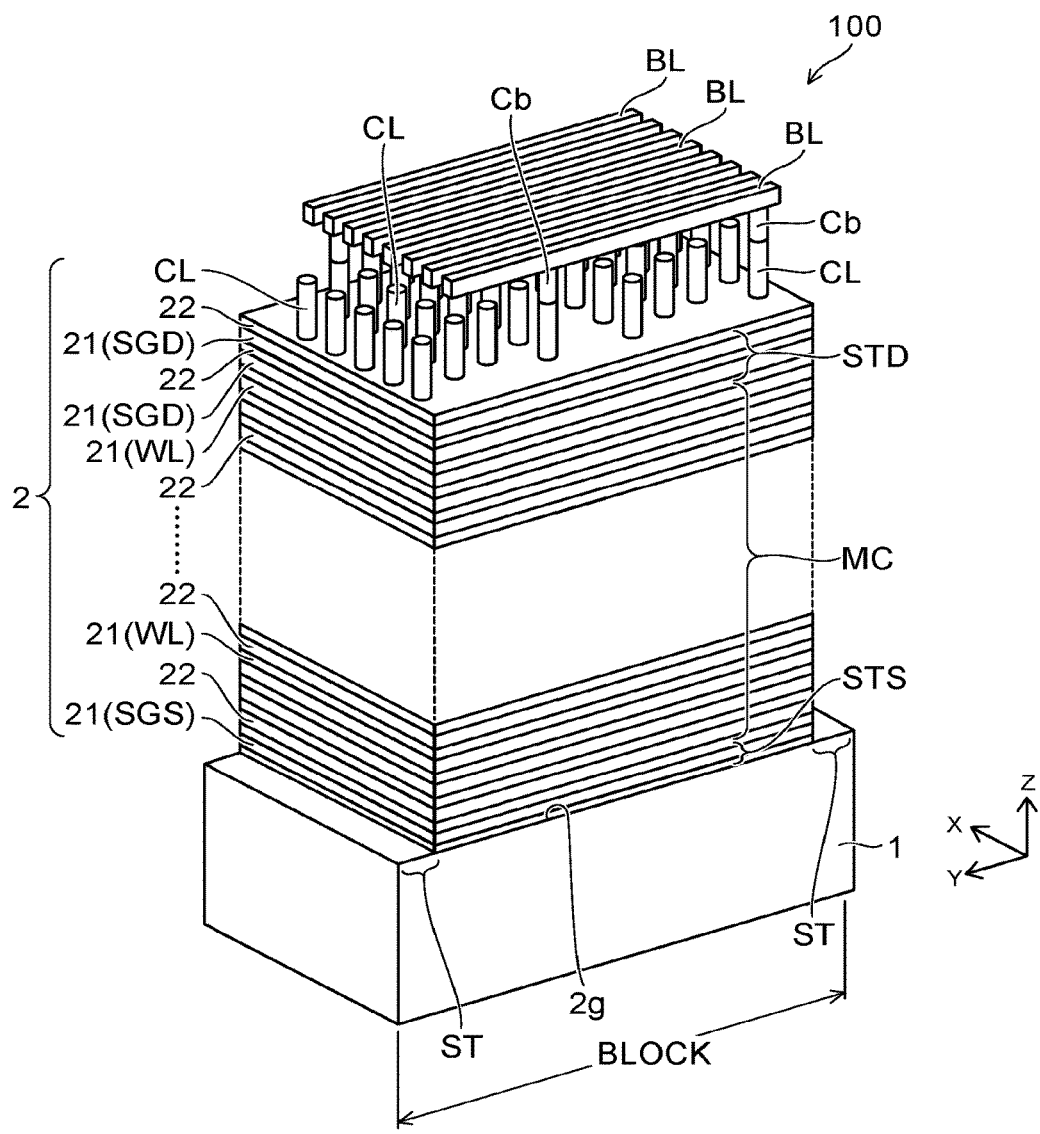
FIG. 1 is a schematic perspective view illustrating a semiconductor device according to an embodiment.

A semiconductor device according to an embodiment includes a semiconductor layer, a first conductive layer, a tunneling insulating film, and a charge trapping film. The tunneling insulating film is provided between the semiconductor layer and the first conductive layer. The charge trapping film is provided between the first conductive layer and the tunneling insulating film. The charge trapping film includes a first separation layer, a first trapping layer, and a second trapping layer. The first trapping layer is positioned between the tunneling insulating film and the first separation layer. The second trapping layer is positioned between the first conductive layer and the first separation layer. A trapping efficiency of charge in the first trapping layer is higher than a trapping efficiency of charge in the second trapping layer.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated. In this specification and each drawing, components similar to ones described in reference to an antecedent drawing are marked with the same reference numerals; and a detailed description is omitted as appropriate.

FIG. 1 is a schematic perspective view illustrating a semiconductor device 100 according to an embodiment. In the specification, a first direction is taken as a Z-axis direction. One direction crossing, e.g., orthogonal to, the Z-axis direction is taken as a second direction. The second direction is an X-axis direction. One direction crossing, e.g., orthogonal to, the Z- and X-axis directions is taken as a third direction. The third direction is a Y-axis direction.

As shown in FIG. 1, the semiconductor device 100 according to the embodiment is nonvolatile memory including memory cells having a three-dimensional structure. The semiconductor device 100 includes a semiconductor substrate 1, a stacked body 2, and multiple columnar portions CL.

The stacked body 2 is provided on the semiconductor substrate 1. For example, an insulating film 2g is provided between the stacked body 2 and the semiconductor substrate 1. The stacked body 2 includes multiple conductive layers 21 and multiple insulating layers 22 stacked alternately along the Z-axis direction. The conductive layers 21 include, for example, tungsten (W). The insulating layers 22 include, for example, silicon oxide ($SiO_2$). The insulating layers 22 insulate between the conductive layers 21. The number of stacks is arbitrary for the conductive layers 21 and for the insulating layers 22.

The conductive layers 21 include at least one source-side select gate SGS, multiple word lines WL, and at least one drain-side select gate SGD. The source-side select gate SGS is a gate electrode of a source-side select transistor STS. The word lines WL are gate electrodes of memory cells MC. The drain-side select gate SGD is a gate electrode of a drain-side select transistor STD. The source-side select gate SGS is provided in the lower region of the stacked body 2. The drain-side select gate SGD is provided in the upper region of the stacked body 2. The lower region refers to the region of the stacked body 2 on the side proximal to the substrate 1; and the upper region refers to the region of the stacked body 2 on the side distal to the substrate 1. The word lines WL are provided between the source-side select gate SGS and the drain-side select gate SGD.

Among the multiple insulating layers 22, the thickness in the Z-axis direction of the insulating layer 22 insulating the source-side select gate SGS and the word line WL may be set to be thicker than, for example, the thickness in the Z-axis direction of the insulating layer 22 insulating the word line WL and the word line WL.

The semiconductor device 100 includes the multiple memory cells MC connected in series between the drain-side select transistor STD and the source-side select transistor STS. The structure in which the drain-side select transistor STD, the memory cells MC, and the source-side select transistor STS are connected in series is called a "memory string" or a "NAND string." For example, the memory string is connected to a bit line BL via a contact Cb. The bit line BL is provided above the stacked body 2 and extends in the Y-axis direction.

Multiple slits ST are provided in the stacked body 2. The slits ST each extend along the X-axis direction and are provided inside the stacked body 2 along the Z-axis direction from the upper end of the stacked body 2 to the lower end of the stacked body 2. In the interior of each of the slits ST, an insulator is provided; or an insulator and a conductor that is insulated from the stacked body 2 by the insulator are provided. The conductor is electrically connected to the semiconductor substrate 1 and is included in, for example, a portion of a source line. The insulator or the insulator and the conductor that are provided inside the slit ST are not illustrated in FIG. 1. The portion of the stacked body 2 interposed between the insulators provided inside the slits ST is called a block (BLOCK) and is included in, for example, the minimum unit of the data erase.

Each of the columnar portions CL is provided inside the stacked body 2 along the Z-axis direction from the upper end of the stacked body 2 to the lower end of the stacked body 2. Each of the columnar portions CL includes a semiconductor layer. Each channel of the drain-side select transistor STD, the memory cells MC, and the source-side select transistor STS is obtained inside the semiconductor layer.

Figure 2A:
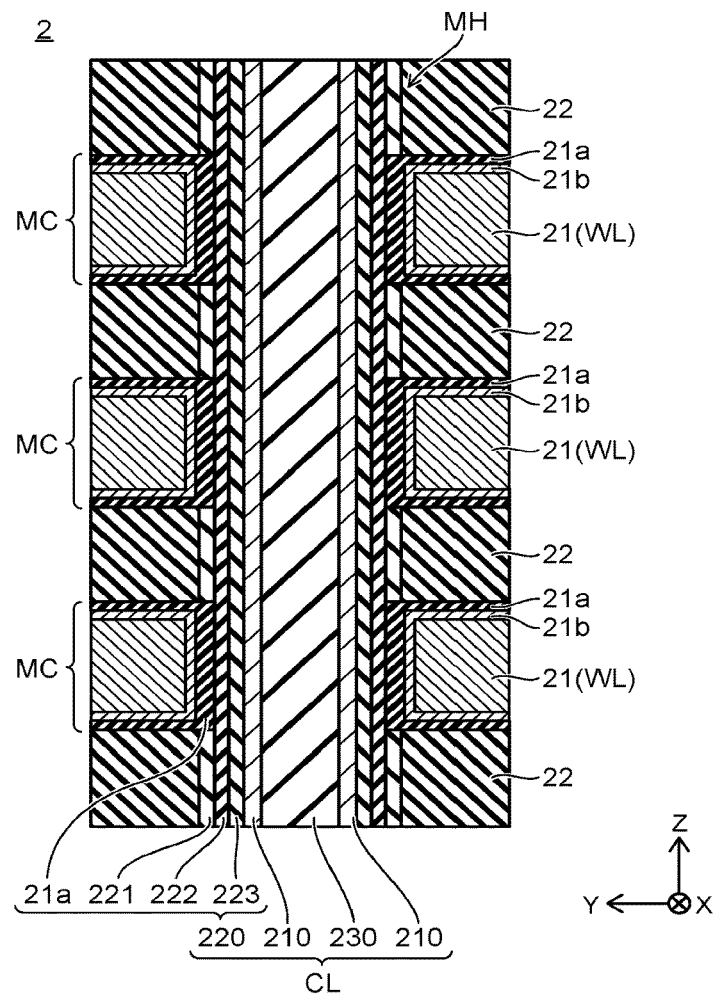
FIG. 2A and FIG. 2B are schematic cross-sectional views illustrating memory cells having a three-dimensional structure.
Figure 2B:
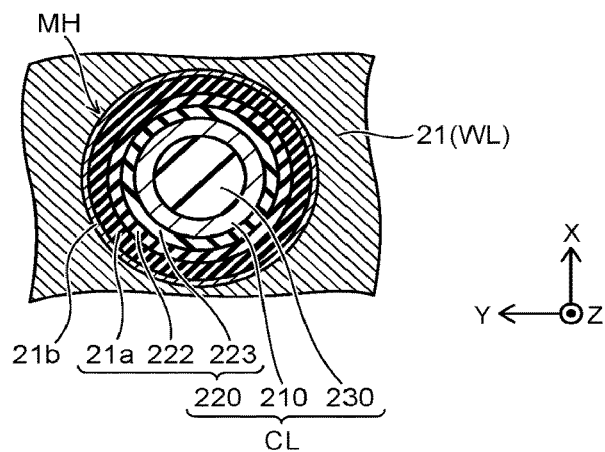

FIG. 2A and FIG. 2B are schematic cross-sectional views illustrating the memory cells MC having the three-dimensional structure. One example of the memory cells MC having the three-dimensional structure is shown as being simplified in FIG. 2A and FIG. 2B. FIG. 2A shows the Y-Z cross section; and FIG. 2B shows the X-Y cross section.

The memory hole MH is provided inside the stacked body 2. The memory hole MH extends in the Z-axis direction. The memory hole MH is provided inside the stacked body 2 along the Z-axis direction from the upper end of the stacked body 2 to the lower end of the stacked body 2. The configuration of the memory hole MH in the X-Y cross section is a circle or an ellipse. The columnar portion CL is provided inside the memory hole MH. The columnar portion CL includes a semiconductor body 210, a memory film 220, and a core layer 230.

A blocking insulating film 21a that is included in a portion of the memory film 220 may be provided between the conductive layer 21 and the insulating layer 22. The blocking insulating film 21a is, for example, a silicon oxide film or a metal oxide film. One example of the metal oxide is aluminum oxide. Also, a barrier film 21b may be provided between the conductive layer 21 and the insulating layer 22 and between the conductive layer 21 and the memory film 220. For example, in the case where the conductive layer 21 is tungsten, for example, a stacked structure film of titanium nitride and titanium is selected as the barrier film 21b. The blocking insulating film 21a suppresses back-tunneling of charge from the conductive layer 21 to the memory film 220 side. The barrier film 21b improves the adhesion between the conductive layer 21 and the blocking insulating film 21a.

The semiconductor body 210 is provided inside the memory hole MH. The configuration of the semiconductor body 210 is, for example, a tubular configuration having a bottom. For example, the semiconductor body 210 includes silicon. The silicon is, for example, polysilicon made of amorphous silicon that is crystallized. The conductivity type of the silicon is, for example, a P-type. The semiconductor body 210 is used to form each channel of the drain-side select transistor STD, the memory cells MC, and the source-side select transistor STS.

The portion of the memory film 220 other than the blocking insulating film 21a is provided between the semiconductor body 210 and the inner wall of the memory hole MH. The configuration of the memory film 220 is, for example, a tubular configuration. The multiple memory cells MC are stacked in the Z-axis direction and are disposed between the semiconductor body 210 and each conductive layer 21 used to form the word lines WL. The memory film 220 includes a cover insulating film 221, a charge trapping film 222, and a tunneling insulating film 223.

The cover insulating film 221 is provided between the conductive layer 21 and the charge trapping film 222 and between the insulating layer 22 and the charge trapping film 222. The cover insulating film 221 includes, for example, silicon oxide. The cover insulating film 221 provides protection so that the charge trapping film 222 is not etched when replacing sacrificial films (not illustrated) with the conductive layers 21 (a replacement process). The cover insulating film 221 may be removed from between the conductive layer 21 and the memory film 220 in the replacement process. In such a case, as shown in FIG. 2A and FIG. 2B, for example, the blocking insulating film 21a is provided between the conductive layer 21 and the charge trapping film 222. Also, the cover insulating film 221 may not be provided in the case where the replacement process is not utilized to form the conductive layers 21.

The charge trapping film 222 is provided between the blocking insulating film 21a and the tunneling insulating film 223 and between the cover insulating film 221 and the tunneling insulating film 223. For example, the charge trapping film 222 includes silicon nitride and has trap sites that trap charge inside a film. The portion of the charge trapping film 222 interposed between the semiconductor body 210 and the conductive layer 21 used to form the word line WL functions as a charge trapping portion. The threshold voltage of the memory cell MC changes according to the existence or absence of the charge inside the charge trapping portion or the amount of the charge trapped inside the charge trapping portion. Thereby, the memory cell MC stores information.

The tunneling insulating film 223 is provided between the semiconductor body 210 and the charge trapping film 222. The tunneling insulating film 223 includes, for example, silicon oxide, or a combination of silicon oxide and silicon nitride. The tunneling insulating film 223 is a potential barrier between the semiconductor body 210 and the charge trapping film 222. Tunneling of electrons or holes occurs in the tunneling insulating film 223 when the electrons are injected from the semiconductor body 210 into the charge trapping portion (a program operation) and when the holes are injected from the semiconductor body 210 into the charge trapping portion (an erase operation).

The semiconductor body 210, the tunneling insulating film 223, and the charge trapping film 222 each extend along the Z-axis direction in which the multiple conductive layers 21 and the multiple insulating layers 22 are arranged. The core layer 230 fills the semiconductor body 210 having the tubular configuration. The configuration of the core layer 230 is, for example, a columnar configuration. The core layer 230 includes, for example, silicon oxide and is insulative.

Figure 3:
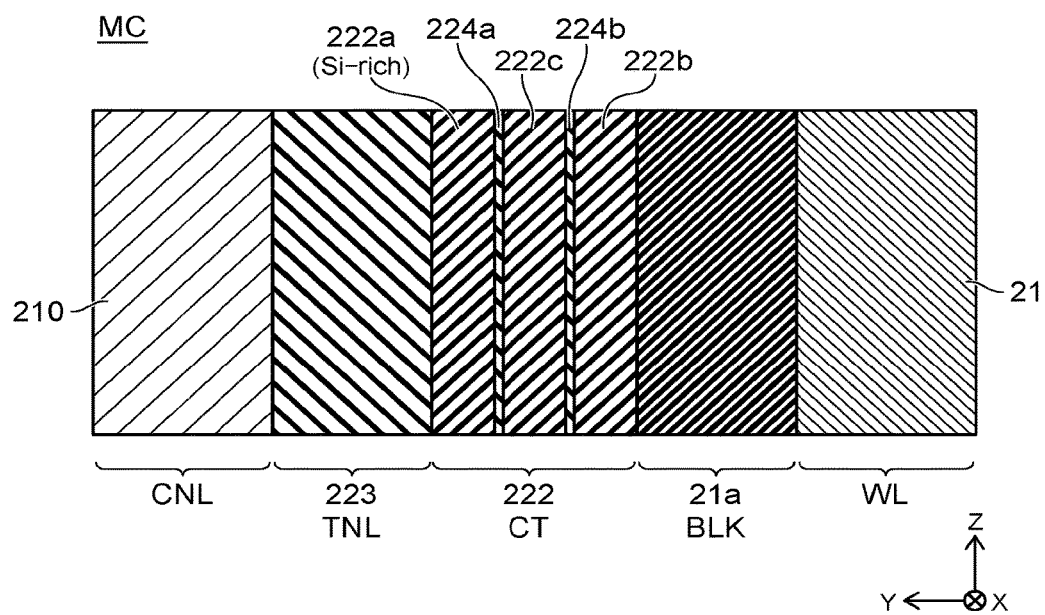
FIG. 3 is a schematic cross-sectional view illustrating an enlargement of the memory cell included in the semiconductor device according to the embodiment.

FIG. 3 is a schematic cross-sectional view illustrating an enlargement of the memory cell MC included in the semiconductor device according to the embodiment. FIG. 3 shows the Y-Z cross section. The barrier film that is between the conductive layer 21 and the blocking insulating film 21a is not illustrated in FIG. 3; and the barrier film similarly is not illustrated in subsequent drawings.

As shown in FIG. 3, the charge trapping film (CT) 222 includes first to third trapping layers 222a to 222c and first and second separation layers 224a and 224b. The first trapping layer 222a is provided between the tunneling insulating film (TNL) 223 and the blocking insulating film (BLK) 21a. The second trapping layer 222b is provided between the blocking insulating film 21a and the first trapping layer 222a. The third trapping layer 222c is provided between the first trapping layer 222a and the second trapping layer 222b. The first separation layer 224a is provided between the first trapping layer 222a and the third trapping layer 222c. The first separation layer 224a contacts the first and third trapping layers 222a and 222c. The second separation layer 224b is provided between the second trapping layer 222b and the third trapping layer 222c. The second separation layer 224b contacts the second and third trapping layers 222b and 222c.

In the embodiment, the first to third trapping layers 222a to 222c each include, for example, silicon and nitrogen and are, for example, silicon nitride films. Further, the charge trapping efficiency of the first trapping layer 222a is higher than the trapping efficiencies of charge of the second and third trapping layers 222b and 222c. Thereby, the charge trapping efficiency of the charge trapping film 222 is higher on the tunneling insulating film 223 side than on the blocking insulating film 21a side.

For example, one method for increasing the charge trapping efficiency of silicon nitride includes, for example, setting the value Si:N of the ratio of silicon and nitrogen to be higher than the stoichiometric ratio. The stoichiometric ratio of silicon nitride is Si:N=3:4=0.75. The charge trapping efficiency of silicon nitride increases as the value Si:N of the ratio exceeds 0.75. In the specification, silicon nitride in which the value Si:N of the ratio is high is called silicon-rich (Si-rich) silicon nitride. In the embodiment, the value Si:N of the ratio in the charge trapping film 222 is higher on the tunneling insulating film 223 side than on the blocking insulating film 21a side. In the embodiment, the first trapping layer 222a is the highest. For example, the value Si:N of the ratio may be the peak value.

The data retention characteristics of the memory cell MC are improved when the structure of the charge trapping film 222 is such that the charge trapping efficiency is high on the tunneling insulating film 223 side. This will now be described step-by-step. An example will be used in which the value Si:N of the ratio is set to be higher than the stoichiometric ratio as a method for locally increasing the charge trapping efficiency of the charge trapping film 222.

Figure 4A:
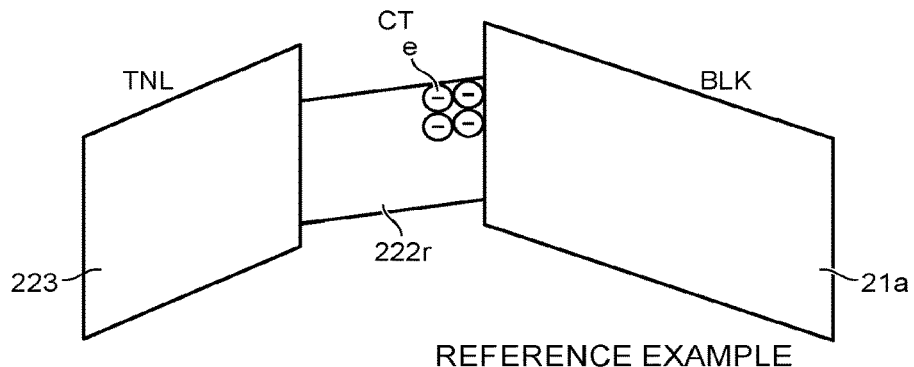
FIG. 4A is a schematic band diagram illustrating an energy band of a memory cell according to a reference example.
Figure 4B:
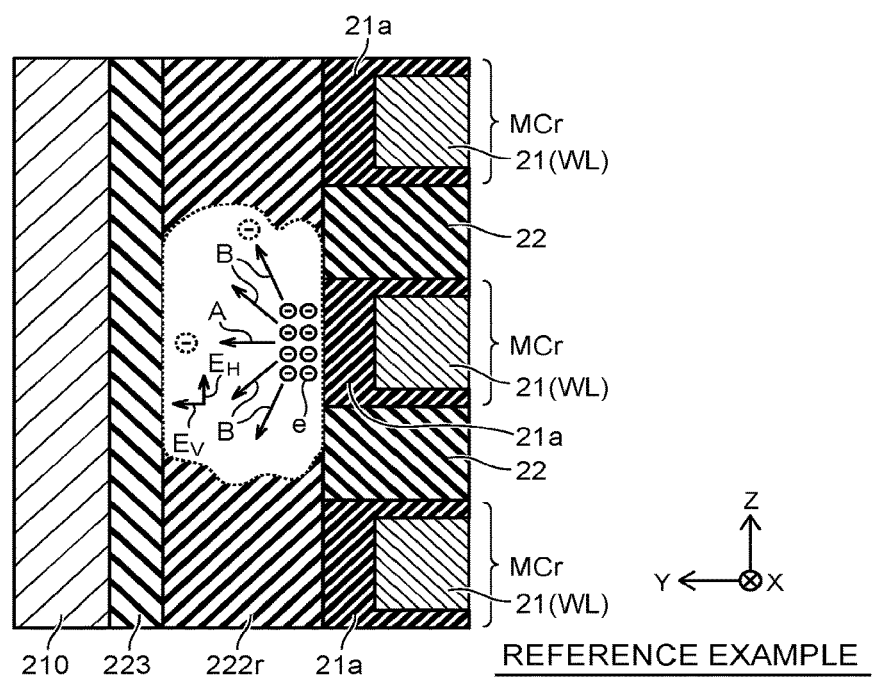
FIG. 4B is a schematic cross-sectional view illustrating the memory cells according to the reference example.
Figure 4C:
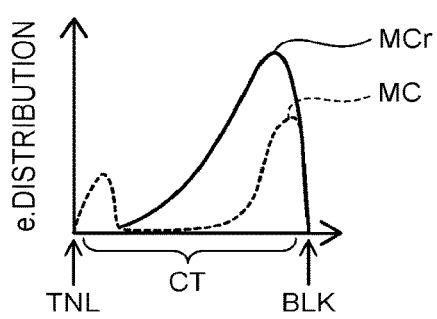
FIG. 4C is a schematic view simply illustrating a distribution of electrons inside a charge trapping film.

FIG. 4A is a schematic band diagram illustrating the energy band of a memory cell MCr according to a reference example (REFERENCE EXAMPLE). FIG. 4B is a schematic cross-sectional view illustrating the memory cells MCr according to the reference example (REFERENCE EXAMPLE). FIG. 4C is a schematic view simply illustrating the distribution (e.DISTRIBUTION) of the electrons inside the charge trapping film (CT). The trapped charge is electrons e.

In the memory cell MCr, the charge trapping efficiency of a charge trapping film 222r is set to be uniform from the tunneling insulating film 223 to the blocking insulating film 21a. The charge trapping film 222r is, for example, silicon nitride. The value Si:N of the ratio of silicon nitride in the charge trapping film 222r is set to be uniform from the tunneling insulating film 223 to the blocking insulating film 21a.

(1) Reference Example: Data Program Operation

In a data program operation as shown in FIG. 4A, the electrons e are injected into the charge trapping film 222r from the tunneling insulating film 223 side toward the blocking insulating film 21a side. In the program operation in the memory cell MCr, many of the electrons e are trapped on the blocking insulating film 21a side of the charge trapping film 222r. For example, many of the electrons e are trapped at the interface vicinity between the charge trapping film 222r and the blocking insulating film 21a.

(2) Reference Example: Data Retention State

After the data program, the memory cell MCr is in a data retention state.

During data retention as shown in FIG. 4B, the following two movements of the trapped electrons e occur due to the repetition of the self-field and the read operation:

A. Movement toward the tunneling insulating film 223

B. Movement spreading toward the periphery of the charge trapping film 222r

For the data retention characteristics, the movement "A" of the electrons e acts in a direction of increasing the threshold voltage of the memory cell MCr. That is, when the movement "A" occurs, the electrons e approach the semiconductor body 210 (the channel). Therefore, the dominance of the electrons e on the channel is strengthened. It can be considered that the likelihood of the movement "A" causing degradation of the data retention characteristics is exceedingly low. It is acceptable for the movement "A" to occur.

The movement "B" of the electrons e occurs with the movement "A." The charge trapping film 222r has a structure that extends along the Z-axis direction and is continuous with another memory cell MCr adjacent in the Z-axis direction. Therefore, when the movement "B" occurs, for example, hopping of the electrons e occurs through the shallow levels inside the charge trapping film 222r; and the electrons e escape out of the region of the memory cell MCr. When the movement "B" occurs, the threshold voltage of the memory cell MCr decreases; and the data retention characteristics degrade.

An electron e that is trapped at the cell end portion vicinity of the memory cell MCr will now be focused upon. The electron e that is trapped at the cell end portion vicinity is affected by an electric field generated by another electron e trapped in another memory cell MCr. The electric field includes an electric field (a vertical electric field: $E_V$) having an orientation perpendicular to the semiconductor body 210 and toward the tunneling insulating film 223, and an electric field (a horizontal electric field: $E_H$) having an orientation parallel to the semiconductor body 210. A force having an oblique orientation is applied easily to the electron e at the cell end portion vicinity because the forces of both electric fields are easily applied. The electron e moves through the shallow levels randomly occurring inside the charge trapping film 222r (the occurrence of the movement "B"). The electron e escapes out of the region of the memory cell MCr; and the threshold voltage of the memory cell MCr undesirably decreases.

Further, in the memory cell MCr as shown in FIG. 4C, many of the electrons e are trapped on the blocking insulating film 21a side of the charge trapping film 222r. Therefore, the electric field due to the self-field of the electrons e strengthens locally on the blocking insulating film 21a side; and this is also a state in which the movements "A" and "B" each occur easily.

For example, the following may be considered as methods for suppressing the movement "B":

Increase the oxygen concentration of the charge trapping film 222r by causing the charge trapping film 222r to further include oxygen inside the silicon nitride film Further provide a layer having a high oxygen concentration in the charge trapping film 222r However, there is a trade-off relationship between these methods and the program characteristics. In these methods, the effective film thickness of the insulating film positioned between the semiconductor body 210 and the conductive layer 21 increases. Therefore, the electric field that is applied to the charge trapping film 222r weakens; and although the suppression of the movement "B" can be expected, the electric field that is applied to the tunneling insulating film 223 also undesirably weakens simultaneously. Therefore, the program characteristics degrade.

Figure 5A:
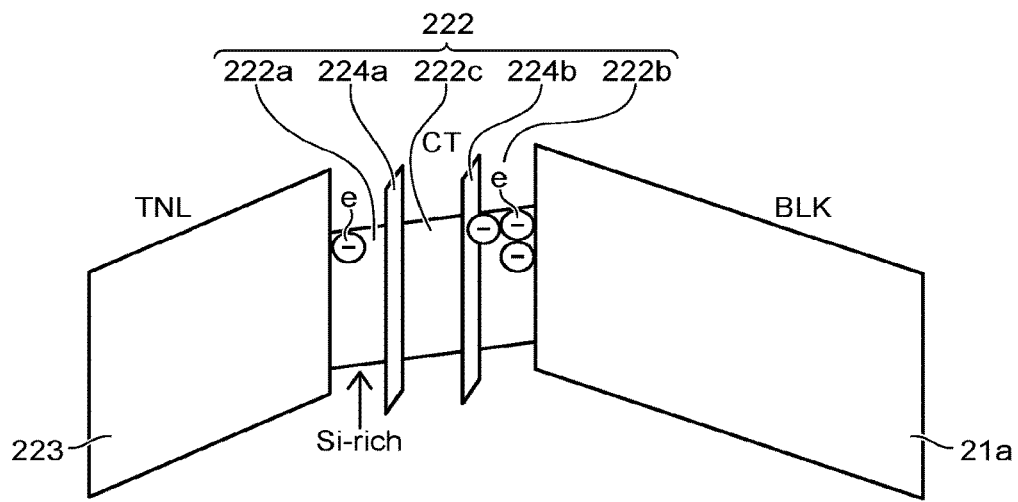
FIG. 5A is a schematic band diagram illustrating an energy band of the memory cell included in the semiconductor device according to the embodiment.
Figure 5B:
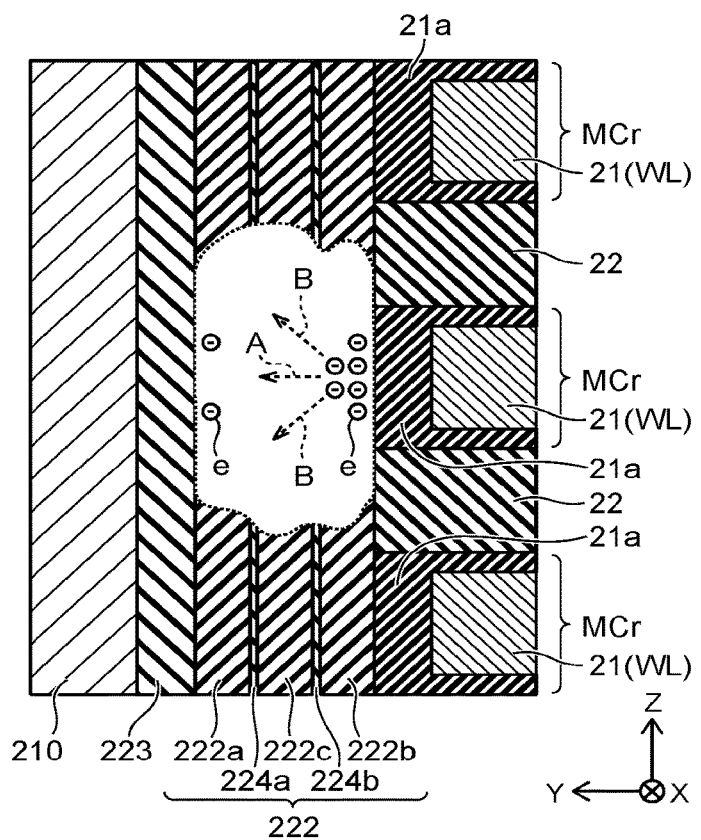
FIG. 5B is a schematic cross-sectional view illustrating the memory cell included in the semiconductor device according to the embodiment.

FIG. 5A is a schematic band diagram illustrating the energy band of the memory cell MC included in the semiconductor device according to the embodiment. FIG. 5B is a schematic cross-sectional view illustrating the memory cell MC included in the semiconductor device according to the embodiment.

As shown in FIG. 5A, the charge trapping film 222 of the memory cell MC includes the first and second separation layers 224a and 224b. The first and second separation layers 224a and 224b each are, for example, silicon oxide. Thus, the occurrence of the movement "B" can be suppressed because the memory cell MC includes the first and second separation layers 224a and 224b inside the charge trapping film 222.

Further, the charge trapping film 222 of the memory cell MC includes the first to third trapping layers 222a to 222c. The first to third trapping layers 222a to 222c each are, for example, silicon nitride. The value Si:N of the ratio is higher in the first trapping layer 222a positioned on the tunneling insulating film 223 side than in the second trapping layer 222b positioned on the blocking insulating film 21a side. That is, the charge trapping efficiency of the first trapping layer 222a is higher than that of the second trapping layer 222b. The value Si:N of the ratio may exceed 0.75 for the entire charge trapping film 222 or for both the tunneling insulating film 223 side and the blocking insulating film 21a side. Even in such a case, the value Si:N of the ratio in the first trapping layer 222a is set to be higher than that of the second trapping layer 222b. Thereby, as described below, degradation of the program characteristics can be suppressed while suppressing the occurrence of the movement "B."

(1) Embodiment: Data Program Operation

In a data program operation as shown in FIG. 5A, the electrons e are injected into the charge trapping film 222 from the tunneling insulating film 223 side toward the blocking insulating film 21a side.

In the memory cell MC, the structure of the first trapping layer 222a proximal to the tunneling insulating film 223 has a structure that traps the charge (the electrons e) more easily than does, for example, the second trapping layer 222b. Accordingly, in the data program operation, many of the electrons e are trapped in the second trapping layer 222b; but a portion of the electrons e can be trapped in the first trapping layer 222a. In the memory cell MC, the electrons e that are trapped are dispersed in the charge trapping film 222.

(2) Embodiment: Data Retention State

After the data program, the memory cell MC is in the data retention state.

In the data retention state as shown in FIG. 5B, for example, the electrons e exist in both the first trapping layer 222a and the second trapping layer 222b. In the memory cell MC as well, the electrons e generate a self-field. For example, in the case where the electrons e exist in both the first trapping layer 222a and the second trapping layer 222b, the movement of the electrons e existing in the second trapping layer 222b is suppressed. For example, the electrons e that exist in the first trapping layer 222a suppress the movement toward the tunneling insulating film 223 side of the electrons e existing in the second trapping layer 222b.

This means that the movement "A" is suppressed. By suppressing the movement "A," the action of increasing the threshold of the memory cell MC weakens. However, in the data program operation of the memory cell MC, the electrons e are already trapped in the first trapping layer 222a. Therefore, even if the occurrence of the movement "A" is suppressed, the advantage of increasing the threshold voltage of the memory cell MC is not lost easily.

Further, in the memory cell MC, it is possible to obtain this advantage even in the case where the charge trapping film 222 includes the first and second separation layers 224a and 224b. The first and second separation layers 224a and 224b suppress the movement of the electrons e from the second trapping layer 222b toward the first trapping layer 222a. However, in the memory cell MC, the electrons e exist in the first trapping layer 222a when the state becomes the data retention state. Accordingly, even in the case where the first and second separation layers 224a and 224b are included, the advantage of increasing the threshold voltage of the memory cell MC is not lost easily.

Figure 6:
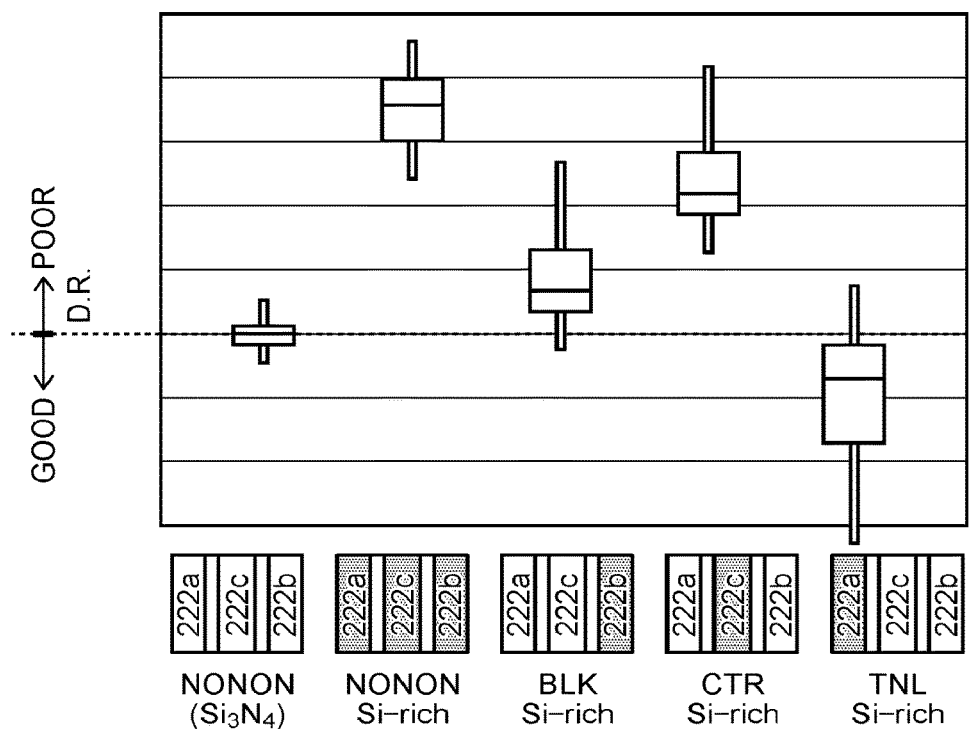
FIG. 6 is a schematic view illustrating data retention characteristics.

FIG. 6 is a schematic view illustrating the data retention characteristics (D.R.).

In FIG. 6, the data retention characteristics are shown for the following:

I. An example in which there is no Si-rich layer having a high charge trapping efficiency in the first to third trapping layers 222a to 222c ($Si_3N_4$)

II. An example in which all of the first to third trapping layers 222a to 222c are Si-rich layers (Si-rich)

III. An example in which the second trapping layer 222b is a Si-rich layer (BLK Si-rich)

IV. An example in which the third trapping layer 222c is a Si-rich layer (CTR Si-rich)

V. An example in which the first trapping layer 222a is a Si-rich layer (TNL Si-rich)

In FIG. 6, example I is used as the reference. In example I, for example, the value Si:N of the ratio is set to about 0.75 for all of the first to third trapping layers 222a to 222c. In FIG. 6, the improvement (GOOD) or the degradation (POOR) of the data retention characteristics is shown with respect to example I.

In example II as shown in FIG. 6, for example, the value Si:N of the ratio is set to be greater than 0.75 for all of the first to third trapping layers 222a to 222c. In example II, the data retention characteristics degrade greatly compared to example I.

In example III, for example, the value Si:N of the ratio in the second trapping layer 222b is set to be greater than 0.75. In example III, the data retention characteristics degrade slightly compared to example I.

In example IV, for example, the value Si:N of the ratio in the third trapping layer 222c is set to be greater than 0.75. In example IV, the data retention characteristics degrade compared to example I.

Thus, for each of example II to example IV as well, the data retention characteristics are worse than those of example I.

Example V is the memory cell MC included in the semiconductor device according to the embodiment. In example V, for example, the value Si:N of the ratio in the first trapping layer 222a is set to be greater than 0.75. Thereby, in example V, the data retention characteristics improve compared to examples I to IV.

For example, it is considered that this is because when the value Si:N of the ratio is set to be higher than about 0.75 for the second and/or third trapping layers 222b and/or 222c, the movement "B" is promoted because the trapped electrons e in the second trapping layer 222b are easily affected by the shallow levels of the second and third trapping layers 222b and 222c.

Conversely, as in example V, the value Si:N of the ratio in the second and third trapping layers 222b and 222c is set to be lower than the value Si:N of the ratio in the first trapping layer 222a. The densities of the shallow levels in the second and third trapping layers 222b and 222c decrease compared to the density of the shallow levels in the first trapping layer 222a. Therefore, the trapped electrons e in the second trapping layer 222b are not easily affected by the shallow levels of the second and third trapping layers 222b and 222c. Moreover, the electrons e are trapped in the first trapping layer 222a. Therefore, compared to the state in which the electrons e are not trapped in the first trapping layer 222a, an electric field that would promote the movement "B" for the trapped electrons e in the second trapping layer 222b can be reduced.

Also, as shown by the broken line in FIG. 4C, the trapping peak of the electrons e occurs at two locations in the memory cell MC. This means that in the data program operation of the memory cell MC, for example, the electrons e that are trapped are dispersed between the first trapping layer 222a proximal to the tunneling insulating film 223 and the second trapping layer 222b proximal to the blocking insulating film 21a.

Conversely, in the memory cell MCr, the trapping peak of the electrons e is at only one location as shown by the solid line in FIG. 4C. That is, in the memory cell MCr, the electrons e that are trapped are not dispersed in the charge trapping film 222r in the data program operation.

Here, it is assumed that the total amount of the trapped electrons e in the charge trapping film 222 and the total amount of the trapped electrons e in the charge trapping film 222r are equal to each other. In such a case, the amount of the trapped electrons e in the second trapping layer 222b of the memory cell MC can be set to be low compared to the amount of the trapped electrons e on the blocking insulating film 21a side of the memory cell MCr.

A region where the electric field is strong occurs locally due to the self-field of the trapped electrons e in each of the charge trapping films 222 and 222r. The strength of the electric field is dependent on the amount of the trapped electrons e. For example, the electric field is stronger in the case where the amount of the trapped electrons e is high. In the state in which the electric field caused by the self-field of the electrons e is strong, the movement "A" and/or the movement "B" occur more easily compared to the weak state. In particular, as described above, the movement "B" undesirably causes a great degradation of the data retention characteristics.

For such a circumstance, in the memory cell MC, the electrons e that are trapped can be dispersed in the charge trapping film 222; therefore, for example, the amount of the electrons e trapped locally in the second trapping layer 222b can be reduced. Therefore, the electric field in the region where a strong electric field is generated locally inside the charge trapping film 222 can be relaxed compared to the memory cell MCr. Accordingly, according to the memory cell MC, for example, the occurrence of the movement "B" can be suppressed more intensely.

Further, the memory cell MC includes at least the first separation layer 224a between the first trapping layer 222a and the second trapping layer 222b. In particular, in the embodiment, the multiple separation layers of the first separation layer 224a contacting the first trapping layer 222a and the second separation layer 224b contacting the second trapping layer 222b are included. The first separation layer 224a suppresses the movement of the trapped electrons e in the first trapping layer 222a; and the second separation layer 224b suppresses the movement of the trapped electrons e in the second trapping layer 222b. The effect of suppressing the occurrence of the movement "B" is high in the first and second separation layers 224a and 224b. Thus, in an embodiment including a separation layer inside the charge trapping film 222, the occurrence of the movement "B" can be suppressed further compared to the case where the separation layer is not included. Also, for example, the effect of suppressing the occurrence of the movement "B" can be obtained more intensely for the case where multiple separation layers exist inside the charge trapping film 222 than for the case where the separation layer is one layer.

Also, it is favorable for the peak value of the value Si:N of the ratio in the first trapping layer 222a to be in a range not less than 0.77 and not more than 0.9. For example, in the case where the peak value of the value Si:N of the ratio in the first trapping layer 222a exceeds 0.9, the number of shallow levels inside the first trapping layer 222a increases; the trapped charge escapes more easily; and the improvement effect of the data retention characteristics undesirably weakens. For example, in the case where the peak value of the value Si:N of the ratio in the first trapping layer 222a is less than 0.77, the charge trapping efficiency cannot be increased very much. In the case where the peak value of the value Si:N of the ratio in the first trapping layer 222a is set to be in the range not less than 0.77 and not more than 0.9, it is sufficient to set, for example, the peak values of the value Si:N of the ratio in the second and third trapping layers 222b and 222c not to exceed the peak value of the value Si:N of the ratio in the first trapping layer 222a.

Thus, according to the memory cell MC included in the semiconductor device according to the embodiment, good data retention characteristics can be obtained.

One example of a method for manufacturing the semiconductor device according to the embodiment will now be described.

FIG. 7A to FIG. 8E are schematic cross-sectional views in order of the processes, illustrating the method for manufacturing the semiconductor device according to the embodiment. For example, the cross sections shown in FIG. 7A to FIG. 8E correspond to the cross section (the Y-Z cross section) shown in FIG. 2A.

Figure 7A:
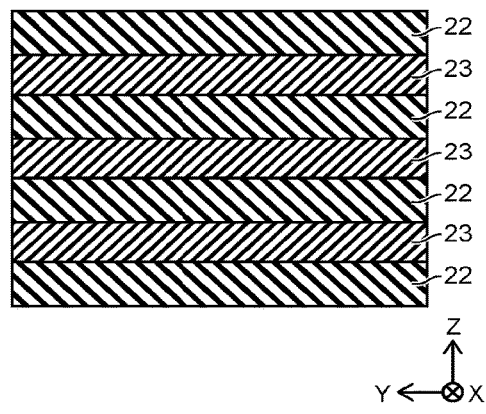
FIG. 7A to FIG. 8E are schematic cross-sectional views in order of processes, illustrating a method for manufacturing the semiconductor device according to the embodiment.

As shown in FIG. 7A, a stacked body is formed on the semiconductor substrate 1 (FIG. 1). The stacked body is formed by stacking the insulating layers 22 and sacrificial films 23 alternately along the Z-axis direction on the semiconductor substrate 1.

Figure 7D:
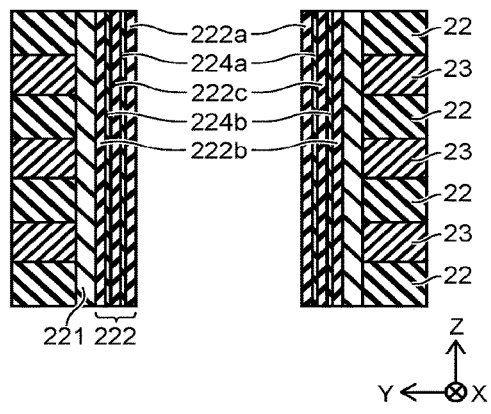
Figure 7B:
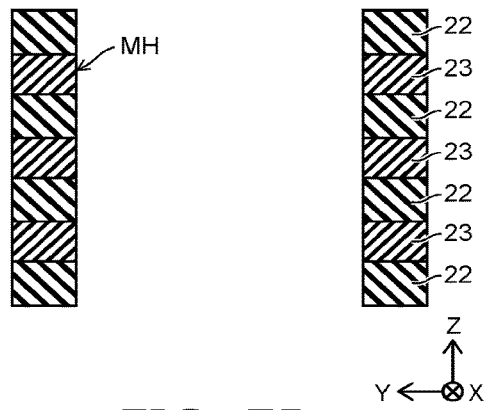

Then, as shown in FIG. 7B, the memory hole MH is formed inside the stacked body along the Z-axis direction from the upper end of the stacked body to the lower end of the stacked body.

Figure 7E:
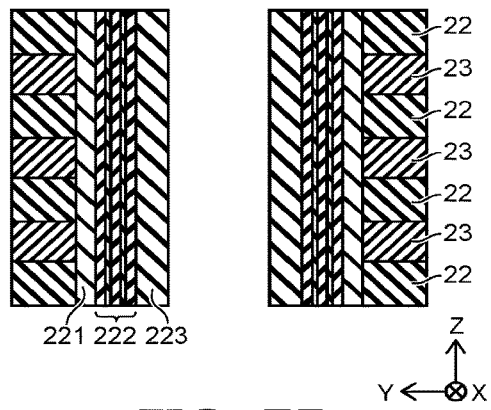
Figure 7C:
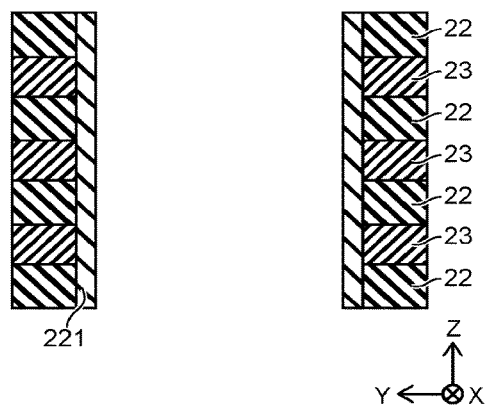

Continuing as shown in FIG. 7C, the cover insulating film 221 is formed inside the memory hole MH along the Z-axis direction from the upper end of the stacked body to the lower end of the stacked body.

Then, as shown in FIG. 7D, the charge trapping film 222 is formed on the cover insulating film 221.

Figure 9:
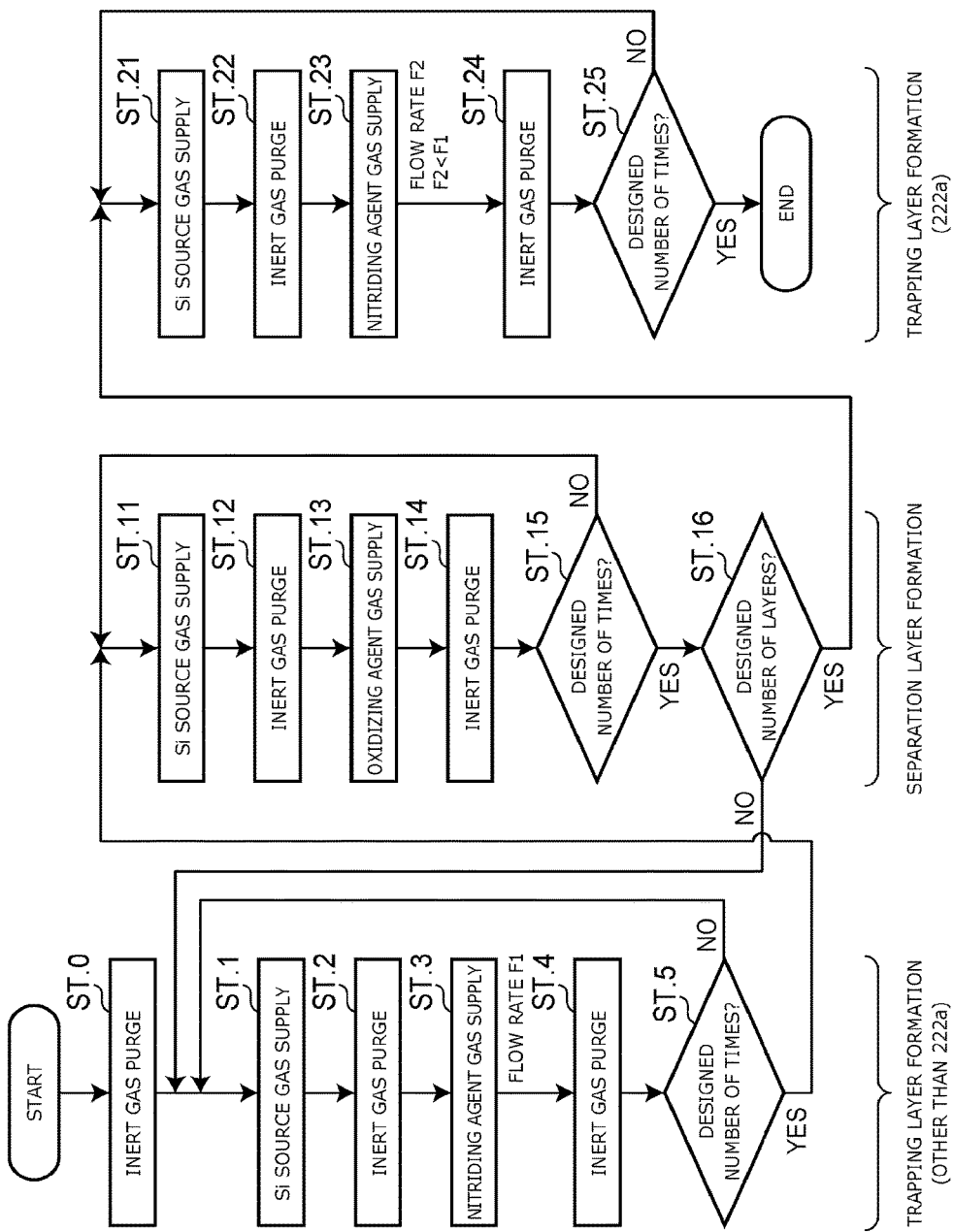
FIG. 9 is a schematic flowchart illustrating one sequence of forming a charge trapping film of the memory cell.

FIG. 9 is a schematic flowchart illustrating one sequence of forming the charge trapping film 222 of the memory cell MC.

The semiconductor device up to when the cover insulating film 221 is formed is placed in the processing chamber of a not-illustrated film formation apparatus.

As shown in step ST.0, the atmosphere inside the processing chamber is purged using an inert gas. Nitrogen gas is one example of the inert gas.

As shown in step ST.1, a silicon (Si) source gas is supplied to the interior of the processing chamber. A silane-based gas is one example of the silicon source gas. Thereby, a thin silicon film is formed on the foundation, e.g., on the cover insulating film 221.

As shown in step ST.2, the atmosphere inside the processing chamber is purged using an inert gas.

As shown in step ST.3, a nitriding agent gas is supplied to the interior of the processing chamber. A gas that includes ammonia is one example of the nitriding agent gas. Thereby, the thin silicon film is nitrided. The flow rate of the nitriding agent gas in step ST.3 is F1.

As shown in step ST.4, the atmosphere inside the processing chamber is purged using an inert gas. The steps from step ST.1 to step ST.4 are a trapping layer formation cycle (other than the first trapping layer 222a).

As shown in step ST.5, it is determined whether or not the trapping layer formation cycle has reached the designed number of times. In the case where it is determined that the designed number of times is not reached (NO), step ST.1 to step ST.4 are repeated. In the case where it is determined that the designed number of times has been reached (YES), it is determined that the second trapping layer 222b has been formed; and the flow proceeds to step ST.11. The designed number of times may be 1 or more.

As shown in step ST.11, a silicon (Si) source gas is supplied to the interior of the processing chamber. Thereby, a thin silicon film is formed on the second trapping layer 222b.

As shown in step ST.12, the atmosphere inside the processing chamber is purged using an inert gas.

As shown in step ST.13, an oxidizing agent gas is supplied to the interior of the processing chamber. A gas including oxygen is one example of the oxidizing agent gas. Thereby, the thin silicon film is oxidized.

As shown in step ST.14, the atmosphere inside the processing chamber is purged using an inert gas. The steps from step ST.11 to step ST.14 are a separation layer formation cycle.

As shown in step ST.15, it is determined whether or not the separation layer formation cycle has reached the designed number of times. In the case where it is determined that the designed number of times is not reached (NO), step ST.11 to step ST.14 are repeated. In the case where it is determined that the designed number of times has been reached (YES), it is determined that the second separation layer 224b has been formed; and the flow proceeds to step ST.16. The designed number of times may be 1 or more.

As shown in step ST.16, it is determined whether or not the number of layers of separation layers has reached the designed number of layers. In the case where it is determined that the designed number of layers has not been reached (NO), the flow returns to step ST.1; step ST.1 to step ST.4 are repeated; and the next trapping layer is formed. In the case where it is determined that the number of layers of separation layers has reached the designed number of layers (YES), the flow proceeds to step ST.21. The designed number of layers may be 1 or more.

As shown in step ST.21, a silicon (Si) source gas is supplied to the interior of the processing chamber. Thereby, a thin silicon film is formed on the foundation, e.g., in the case where the number of layers of separation layers is 2, formed on the first separation layer 224a.

As shown in step ST.22, the atmosphere inside the processing chamber is purged using an inert gas.

As shown in step ST.23, a nitriding agent gas is supplied to the interior of the processing chamber. Thereby, the thin silicon film is nitrided. The flow rate of the nitriding agent gas in step ST.23 is F2. For example, the flow rate F2 is set to be lower than the flow rate F1 (F2<F1); for example, the environment is such that the thin silicon film is nitrided less easily than in step ST.3. Thereby, silicon-rich silicon nitride is formed; for example, the first trapping layer 222a that has a higher charge trapping efficiency than the second trapping layer 222b is formed.

As shown in step ST.24, the atmosphere inside the processing chamber is purged using an inert gas. The steps from step ST.21 to step ST.24 are a first trapping layer 222a formation cycle.

As shown in step ST.25, it is determined whether or not the first trapping layer 222a formation cycle has reached the designed number of times. In the case where it is determined that the designed number of times is not reached (NO), step ST.21 to step ST.24 are repeated. In the case where it is determined that the designed number of times has been reached (YES), it is determined that the first trapping layer 222a has been formed; and the formation of the charge trapping film 222 ends. The designed number of times may be 1 or more.

Then, as shown in FIG. 7E, the tunneling insulating film 223 is formed on the charge trapping film 222.

Continuing, although not particularly illustrated, the cover insulating film 221, the charge trapping film 222, and the tunneling insulating film 223 are removed from the bottom of the memory hole MH; and the semiconductor substrate 1 is exposed at the bottom of the memory hole MH.

Figure 7F:
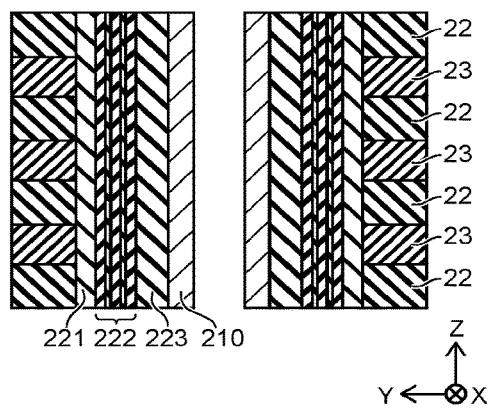

Then, as shown in FIG. 7F, the semiconductor body 210 that is electrically connected to the semiconductor substrate 1 is formed on the tunneling insulating film 223.

Figure 8A:
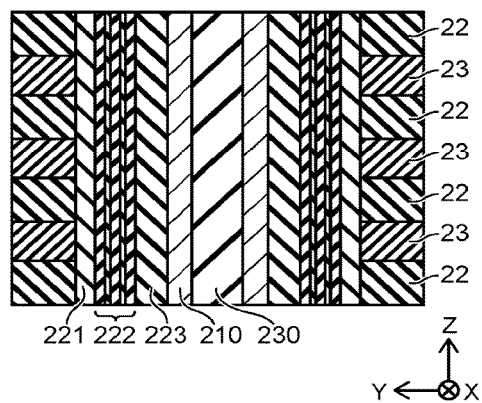

Continuing as shown in FIG. 8A, the core layer 230 is formed on the semiconductor body 210. Thereby, the interior of the memory hole MH is filled with the cover insulating film 221, the charge trapping film 222, the tunneling insulating film 223, the semiconductor body 210, and the core layer 230.

Continuing, the slits ST are formed along the Z-axis direction from the upper end of the stacked body to the lower end of the stacked body (FIG. 1).

Figure 8D:
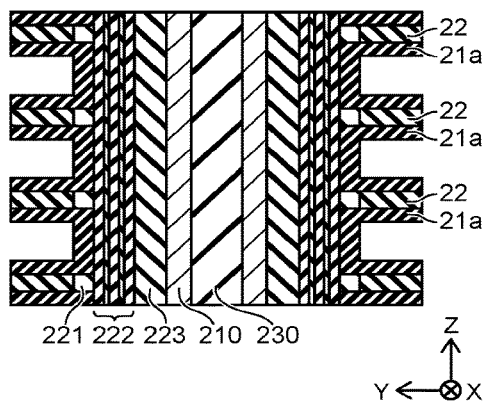
Figure 8B:
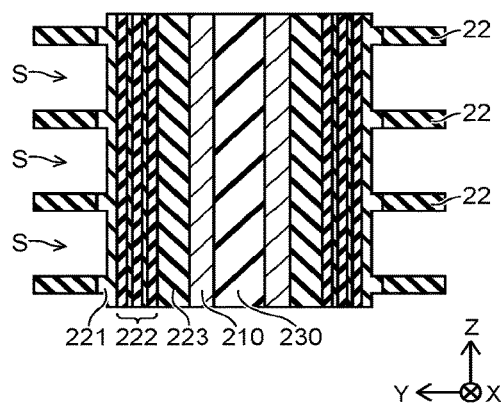

Then, as shown in FIG. 8B, the sacrificial films 23 are removed via the slits ST. Thereby, a space S is formed between the insulating layers 22. The insulating layers 22 include, for example, silicon oxide; and sacrificial films 23 include, for example, silicon nitride. For example, wet etching that uses a heated etchant including phosphoric acid is used to remove the sacrificial films 23.

Figure 8E:
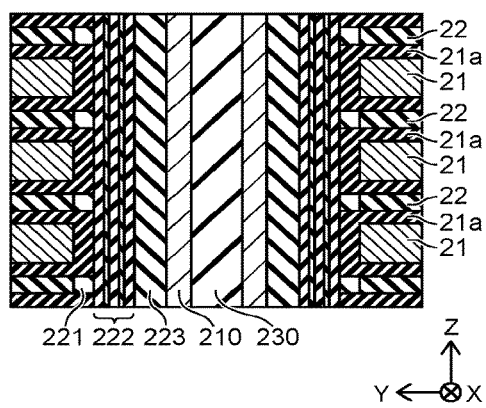
Figure 8C:
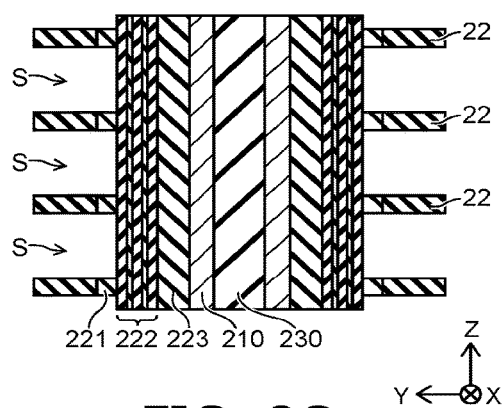

Continuing as shown in FIG. 8C, the cover insulating film 221 is removed via the space S. Thereby, for example, the charge trapping film 222 is exposed inside the space S.

Then, as shown in FIG. 8D, the blocking insulating film 21a is formed via the slits ST on the surface of the charge trapping film 222 and the surfaces of the insulating layers 22 exposed inside the space S.

Continuing as shown in FIG. 8E, a metal (a conductor) is filled into the interior of the space S via the slits ST. Thereby, a stacked body is formed in which the multiple conductive layers 21 are stacked in the Z-axis direction with the insulating layers 22 interposed. Before forming the conductive layers 21, the barrier film 21b may be formed via the slits ST on the surface of the blocking insulating film 21a exposed inside the space S.

Subsequently, although not particularly illustrated, using well-known methods, the interiors of the slits ST are filled with an insulator or with an insulator and a conductor; further, the bit lines BL, etc., are formed on the stacked body. Thus, for example, the semiconductor device 100 according to the embodiment can be manufactured.

According to such a manufacturing method, in the process of forming the charge trapping film 222, for example, it is unnecessary to repeatedly transfer and dispatch the semiconductor device 100 into and out of the processing chamber of the film formation apparatus when manufacturing. Therefore, an advantage can be obtained in that the semiconductor device 100 can be manufactured while suppressing the decrease of the throughput.

Also, in the manufacturing method recited above, the supply process of the silicon source gas (step ST.11) and the inert gas purge process (step ST.12) continuing from this process are performed in the separation layer formation cycle. It is also possible to omit step ST.11 and step ST.12. In the case of the omission, the second separation layer 224b, etc., that are formed become silicon oxynitride films from the silicon oxide films. The second separation layer 224b and the like may be silicon oxynitride films.

First Modification of Memory Cell

Figure 10:
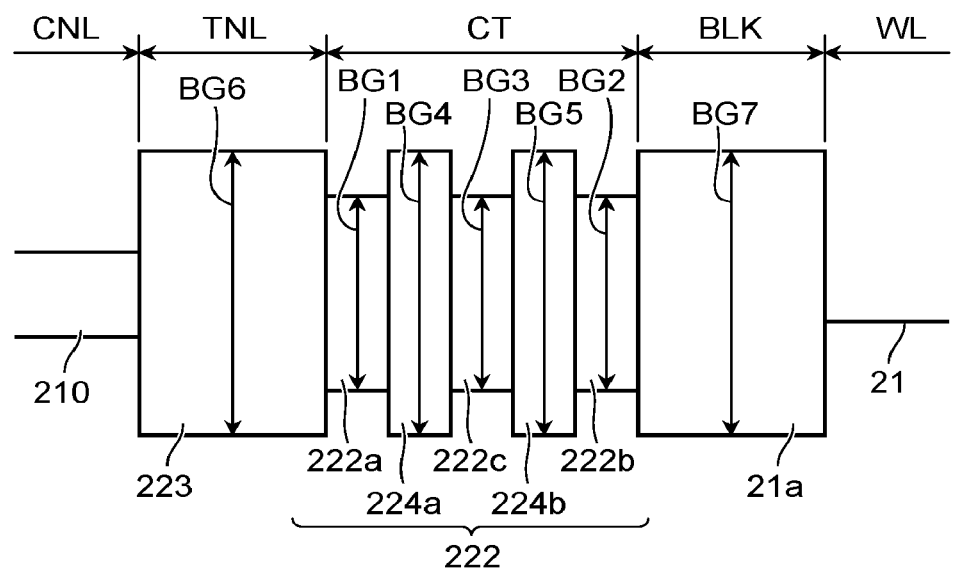
FIG. 10 is a schematic band diagram illustrating an energy band of a memory cell according to a first modification.

FIG. 10 is a schematic band diagram illustrating the energy bands of a memory cell according to a first modification. FIG. 10 shows the state of no electric field.

As shown in FIG. 10, in the case where the charge trapping film 222 includes, for example, the first and second separation layers 224a and 224b, bandgaps BG4 and BG5 of the first and second separation layers 224a and 224b may be set to be wider than, for example, bandgaps BG1 to BG3 of the first to third trapping layers 222a to 222c of the charge trapping film 222. Thereby, the occurrence of the movements "A" and "B" of the electrons e can be suppressed even further.

As long as the bandgaps BG4 and BG5 are wider than the bandgaps BG1 to BG3, the first and second separation layers 224a and 224b are not limited to silicon oxide. For example, as described in the manufacturing method, the first and second separation layers 224a and 224b may be silicon oxynitride, a metal nitride, or a metal oxide.

Also, for example, the bandgaps BG1 to BG3 are set to be narrower than a bandgap BG6 of the tunneling insulating film 223. Thereby, the charge trapping film 222 can have a structure in which the electrons e that tunnel from the semiconductor body 210 through the tunneling insulating film 223 are trapped easily.

As long as the bandgaps BG1 to BG3 are narrower than the bandgap BG6, the first to third trapping layers 222a to 222c are not limited to silicon nitride. For example, a metal oxide or a metal nitride that can trap charge may be used.

To actively improve the data programming characteristics of the charge trapping film 222 of the memory cell MC, the charge trapping film 222 may further include a metallic element that can scatter the electrons e. The first trapping layer 222a may further include such a metallic element; or the first to third trapping layers 222a to 222c may further include such a metallic element while allowing the high charge trapping efficiency of the first trapping layer 222a to remain. It is possible to further improve the data programming characteristics of the memory cell MC by any of these methods.

Also, in the embodiment recited above, the value Si:N of the ratio is set to be higher than the stoichiometric ratio (silicon-rich) to increase the charge trapping efficiency of the charge trapping film 222 on the tunneling insulating film 223 side. However, for example, this is merely one method for increasing the charge trapping efficiency of silicon nitride. It is also possible to locally increase the charge trapping efficiency of the charge trapping film 222 by using another method. For example, the base of the charge trapping film 222 is set to be silicon nitride. In such a case, other than the method for making the silicon nitride silicon-rich, a method in which an additive is added may be employed. For example, the additive is at least one selected from the group consisting of carbon, aluminum, hafnium, zinc, and titanium. For example, the concentration of the additive is set to be high on the tunneling insulating film side. In the embodiment recited above, for example, the first trapping layer 222a includes the additive recited above. Further, for example, the first to third trapping layers 222a to 222c each may include the additive recited above. In such a case, for example, it is sufficient to set the concentration of the additive to be the highest in the first trapping layer 222a.

Also, for example, a metal compound which has a charge trapping efficiency that is higher than that of silicon nitride which has a value Si:N of the ratio of about 0.75 may be used as the first trapping layer 222a of the charge trapping film 222. For example, the metal compound is at least one selected from the group consisting of a metal oxide, a metal nitride, and a metal oxynitride. To suppress the diffusion of the metallic element in the case where a metal oxide is used, a stacked structure with one of silicon nitride, a metal nitride, or a metal oxynitride may be used; or a sandwich structure in which a metal oxide is interposed between one of silicon nitride, a metal nitride, or a metal oxynitride may be used. Further, for example, the first to third trapping layers 222a to 222c each may include the metal compound recited above. In such a case, for example, the charge trapping efficiency is set to be the highest in the first trapping layer 222a.

Further, for example, a bandgap BG7 of the blocking insulating film 21a is set to be wider than the bandgaps BG1 to BG3. Thereby, a structure is possible in which back-tunneling of the electrons e from the conductive layer 21 does not occur easily.

Figure 11A:
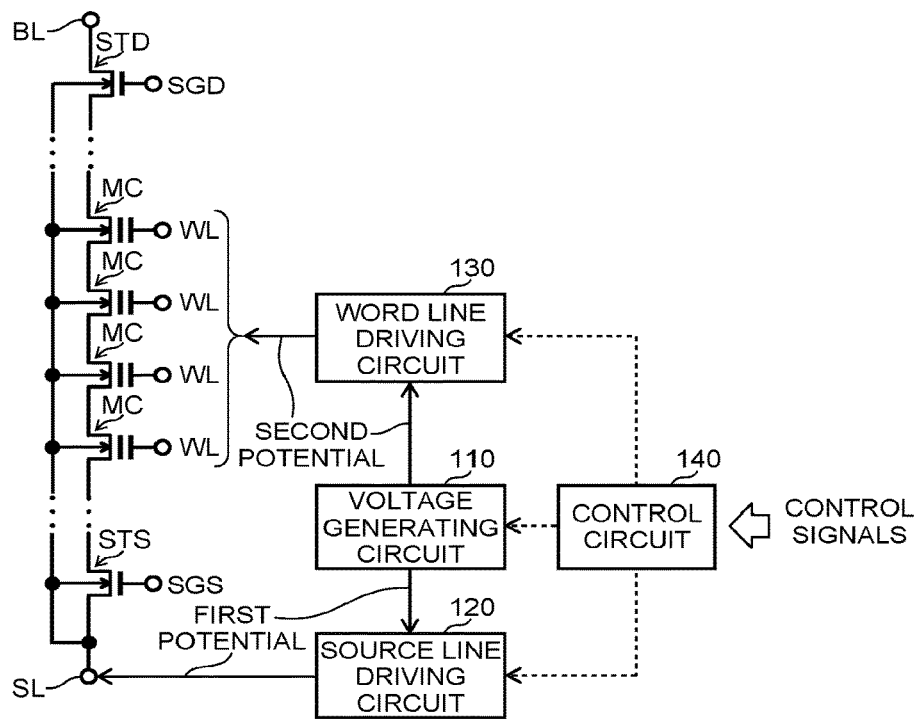
FIG. 11A is an equivalent circuit diagram summarily illustrating circuits of a NAND string periphery included in the semiconductor device according to the embodiment.
Figure 11B:
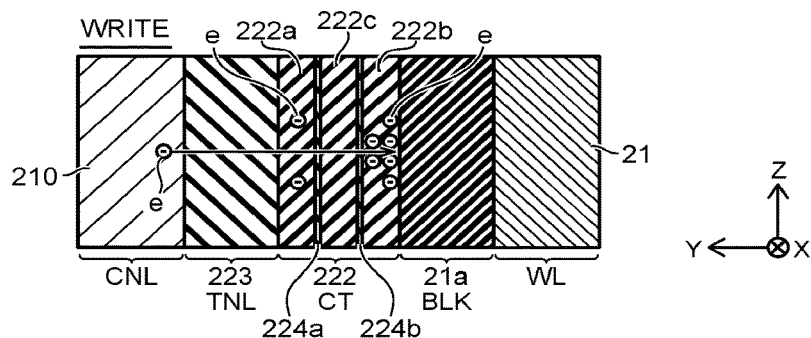
FIG. 11B is a schematic cross-sectional view illustrating tunneling of electrons in a data program operation of the memory cell.
Figure 11C:
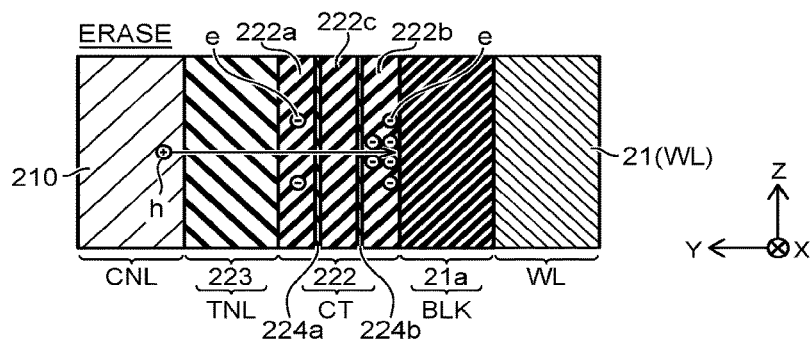
FIG. 11C is a schematic cross-sectional view illustrating tunneling of holes in a data erase operation of the memory cell.

FIG. 11A is an equivalent circuit diagram summarily illustrating circuits of the NAND string periphery included in the semiconductor device according to the embodiment. FIG. 11B is a schematic cross-sectional view illustrating the tunneling of the electrons e in the data program operation of the memory cell MC (WRITE). FIG. 11C is a schematic cross-sectional view illustrating the tunneling of the holes h in the data erase operation of the memory cell MC (ERASE).

As shown in FIG. 11A, the semiconductor device 100 further includes a voltage generating circuit 110, a source line driving circuit 120, a word line driving circuit 130, and a control circuit 140. For example, these circuits are provided in the semiconductor substrate 1.

The voltage generating circuit 110 generates the voltages used in the semiconductor device 100. The source line driving circuit 120 supplies, to a source line SL, a first potential (FIRST POTENTIAL) from the voltage generating circuit 110, etc. The word line driving circuit 130 supplies, to the word lines WL, a second potential (SECOND POTENTIAL) from the voltage generating circuit 110, etc. For example, the control circuit 140 controls the voltage generating circuit 110, the source line driving circuit 120, and the word line driving circuit 130 according to control signals (CONTROL SIGNALS) output from an external host (not illustrated).

1. Data Program Operation

In the data program operation, the control circuit 140 sets the second potential to be higher than the first potential. At this time, the first potential is, for example, a ground potential. The second potential is a programming voltage Vpgm or a pass voltage Vpass. The pass voltage Vpass is a potential that causes the memory cell MC having the highest threshold to conduct. The programming voltage Vpgm is a potential that is higher than the pass voltage Vpass.

For example, in the memory cell MC in which the potential of the word line WL is set to the programming voltage Vpgm, the electrons e tunnel from the semiconductor body 210 into the tunneling insulating film 223 as shown in FIG. 11B and are injected into the charge trapping film 222. At this time, the electrons e are trapped and are dispersed between the first trapping layer 222a on the tunneling insulating film 223 side and the second trapping layer 222b on the blocking insulating film 21a side.

2. Data Erase Operation

In the data erase operation, the control circuit 140 sets the first potential to be higher than the second potential. At this time, the first potential is, for example, an erasing potential Vera. The second potential is the ground potential.

Further, in the data erase operation, for example, the erasing potential Vera is supplied also to the bit lines BL; and the potentials of the drain and the source of the NAND string are set to a high state. Subsequently, the potentials of the drain-side select gate SGD and the source-side select gate SGS are increased. Thereby, a hole current due to GIDL (Gate Induced Drain Leakage) flows in the semiconductor body 210. Then, as shown in FIG. 11C, the holes h tunnel from the semiconductor body 210 through the tunneling insulating film 223 and are injected into the charge trapping film 222.

Thus, in the semiconductor device 100, the injection direction of the charge (the electrons e) when programming data may be set to be the same as the injection direction of the reverse-polarity charge (the holes h) of the data erase. In the memory cell MC, a portion of the electrons e is trapped in the first trapping layer 222a on the tunneling insulating film 223 side. The electrons e of the first trapping layer 222a are proximal to the tunneling insulating film 223. Therefore, the trapped electrons e in the first trapping layer 222a are easily neutralized electrically by the holes h that tunneled through the tunneling insulating film 223.

In the case where the trapping efficiency of the charge, e.g., electrons e, is set to be high on the tunneling insulating film 223 side of the charge trapping film 222, it is considered that the data erasing characteristics may degrade if a method is employed as the erasing method of the data in which the electrons e are extracted from the charge trapping film 222 into the semiconductor body 210. This is because in the data erase operation, the electrons e that were trapped in the second trapping layer 222b move into the semiconductor body 210. The electrons e pass through the first trapping layer 222a at this time. Therefore, the likelihood is high that the electrons e may undesirably be re-trapped in the first trapping layer 222a of the charge trapping film 222.

In the data erase operation, the erasing pulse between the conductive layer 21 and the semiconductor body 210 is repeatedly applied until the threshold of the memory cell MC decreases to be sufficiently in the range of the erased state. In the case where the likelihood is high that the electrons e may undesirably be re-trapped in the first trapping layer 222a of the charge trapping film 222, for example, the number of applications of the erasing pulse is increased; the number of times the erase verify read operation is performed after the erasing pulse application is increased; and a long length of time is undesirably necessary to erase the data. In other words, the data erasing characteristics of the nonvolatile memory degrade.

For example, such a possibility of the re-trap of the electrons e is higher for the case where a separation layer (e.g., the first and second separation layers 224a and 224b) that has a wider bandgap than the first and second trapping layers 222a and 222b is included between the second trapping layer 222b and the first trapping layer 222a than for the case where the separation layer is not provided.

Further, in the nonvolatile memory, for example, there is a tendency for the number of applications of the erasing pulse to increase as the erasing through programming are repeated. This is because, as the erasing through programming are repeated, the electrons e that drop into deep levels occurring in the charge trapping film 222 and the tunneling insulating film 223 increase gradually. For example, it is difficult to extract the electrons e that drop into the deep levels by using only the erase sequence of extracting the electrons e from the charge trapping film 222 that is programmed in the control device and/or the state machine of the nonvolatile memory. Therefore, the electrons e accumulate inside the deep levels in the actual use of the nonvolatile memory.

The electrons e that accumulate inside the deep levels act to cause the threshold of the memory cell MC to increase. Accordingly, in the case where the electrons e accumulating inside the deep levels increase, it becomes difficult to reduce the threshold of the memory cell MC sufficiently to the range of the erased state when erasing data.

Also, the electrons e that accumulate inside the deep levels act to weaken the electric field between the semiconductor body 210 and the conductive layer (the word line WL) 21. Therefore, the electric field is not applied easily to the tunneling insulating film 223 when programming data. Accordingly, in the case where the electrons e accumulating inside the deep levels increase, it is difficult to increase the threshold of the memory cell MC sufficiently to the range of the program state when programming data.

For example, these circumstances cause the occurrence of erase errors and/or program errors in the actual use of the nonvolatile memory. The so-called endurance characteristics of the nonvolatile memory degrade.

For example, in the case where the first trapping layer 222a in which the charge trapping efficiency is high is included on the tunneling insulating film 223 side as in the memory cell MC, if a method is used as the data erasing method in which the electrons e are extracted from the charge trapping film 222 into the semiconductor body 210, the likelihood of the electrons e being re-trapped in the first trapping layer 222a increases in the data erase operation; and the probability of the electrons e dropping into the deep levels increases. Therefore, there is a risk that the endurance characteristics of the nonvolatile memory also may be lost undesirably. The nonvolatile memory has a shorter life.

For example, such degradation of the data erasing characteristics and such degradation of the endurance characteristics can be suppressed by using a data erasing method in which the holes h are injected from the semiconductor body 210 into the charge trapping film 222 as in the semiconductor device 100 according to the embodiment.

The data program method may be a method in which the electrons e are injected from the semiconductor body 210 into the charge trapping film 222. In other words, the polarity of the charge may be reversed such as between the electrons e or the holes h when erasing data and programming data; and the injection direction of the charge may be one-way, i.e., from the semiconductor body 210 into the conductive layer 21 or from the conductive layer 21 toward the semiconductor body 210 for both erasing data and programming data. Thereby, degradation of the data erasing characteristics and degradation of the endurance characteristics can be suppressed for the nonvolatile memory that includes the memory cell MC that locally includes a location where the charge trapping efficiency is high inside the charge trapping film 222 on the semiconductor body 210 side or the conductive layer 21 side.

Accordingly, for example, in the semiconductor device 100 according to the embodiment, for example, the method of injecting the electrons e from the semiconductor body 210 into the charge trapping film 222 is employed as the data program method; and as the data erasing method, for example, the method of injecting the holes h from the semiconductor body 210 into the charge trapping film 222 is employed. Thereby, further improvement of the data erasing characteristics and the endurance characteristics of the memory cell MC can be expected while maintaining good data retention characteristics of the memory cell MC. Moreover, these advantages can be obtained for the memory cell MC that includes a location where the charge trapping efficiency is high on the tunneling insulating film 223 side inside the charge trapping film 222 while including at least one separation layer inside the charge trapping film 222.

Figure 12A:
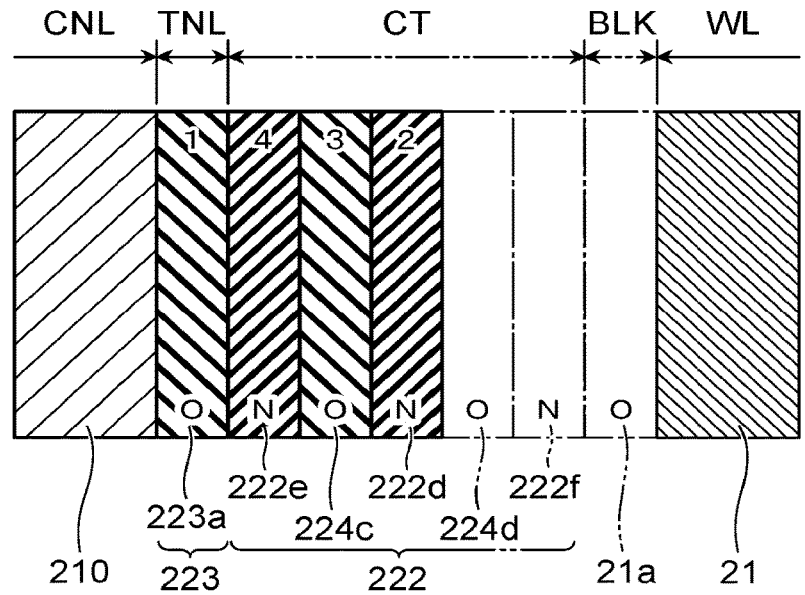
FIG. 12A is a schematic cross-sectional view illustrating a first example of a generalized memory cell.
Figure 12B:
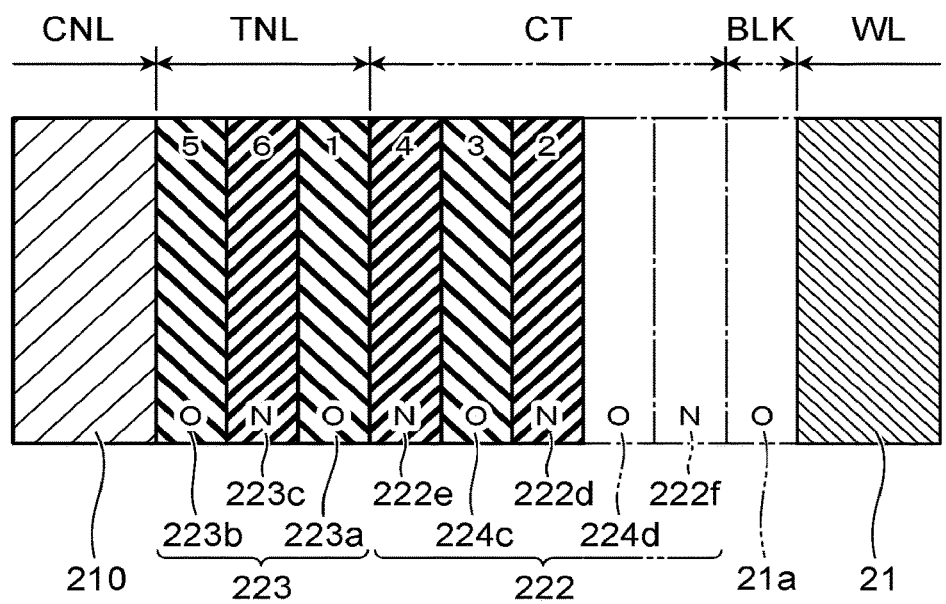
FIG. 12B is a schematic cross-sectional view illustrating a second example of the generalized memory cell MC.

FIG. 12A is a schematic cross-sectional view illustrating a first example of the generalized memory cell MC. FIG. 12B is a schematic cross-sectional view illustrating a second example of the generalized memory cell MC.

As shown in FIG. 12A, the generalized memory cell MC according to the first example includes the semiconductor body (the semiconductor layer) 210, the conductive layer 21, a first insulating film 223a, a second insulating film 222d, a third insulating film 224c, and a fourth insulating film 222e.

The first insulating film 223a is provided between the semiconductor body 210 and the conductive layer 21. The first insulating film 223a includes silicon and oxygen (O) and is, for example, a silicon oxide film. The second insulating film 222d is provided between the conductive layer 21 and the first insulating film 223a. The second insulating film 222d includes silicon and nitrogen (N) and is, for example, a silicon nitride film. The third insulating film 224c is provided between the first insulating film 223a and the second insulating film 222d. The third insulating film 224c includes silicon and oxygen (O) and is, for example, a silicon oxide film. The fourth insulating film 222e is provided between the first insulating film 223a and the third insulating film 224c. The fourth insulating film 222e includes silicon and nitrogen (N) and is, for example, a silicon nitride film. The value Si:N of the ratio of silicon and nitrogen in the fourth insulating film 222e is higher than in the second insulating film 222d.

The generalized memory cell MC according to the first example also includes at least the four-layer structure of (silicon oxide/silicon nitride/silicon oxide/silicon nitride) (called an ONON structure) between the semiconductor body 210 and the conductive layer 21. The value Si:N of the ratio in the fourth insulating film 222e which is the silicon nitride film most proximal to the semiconductor body 210 is set to be higher than in the second insulating film 222d.

According to the generalized memory cell MC according to the first example, for example, the first insulating film 223a can be identified as the tunneling insulating film 223; for example, the second insulating film 222d can be identified as the second trapping layer 222b; for example, the third insulating film 224c can be identified as the first separation layer 224a; for example, the fourth insulating film 222e can be identified as the first trapping layer 222a.

However, a semiconductor device for improving the data programming characteristics and the data erasing characteristics is known in which the tunneling insulating film 223 has a three-layer structure of (silicon oxide/silicon nitride/silicon oxide) (called an ONO structure hereinbelow). The charge trapping film is, for example, silicon nitride. Therefore, in the semiconductor device in which the tunneling insulating film has the ONO structure, the ONON structure is included between the semiconductor layer and the conductive layer. This closely resembles the structure of the memory cell MC shown in FIG. 12A.

However, according to the memory cell MC, the value Si:N of the ratio of silicon and nitrogen in the fourth insulating film 222e provided between the first insulating film 223a and the third insulating film 224c is set to be higher than in the second insulating film 222d to increase the charge trapping efficiency.

In the semiconductor device in which the tunneling insulating film has the ONO structure, the silicon nitride that is positioned at the portion corresponding to the second insulating film 222d is the charge trapping film. Also, the silicon nitride that is positioned at the portion corresponding to the fourth insulating film 222e is a portion of the tunneling insulating film. The charge trapping efficiency of the silicon nitride positioned at the portion corresponding to the fourth insulating film 222e is not set to be high.

Accordingly, the memory cell MC that includes at least an ONON structure between the semiconductor body 210 and the conductive layer 21 and in which the value Si:N of the ratio in the fourth insulating film 222e which is the silicon nitride film most proximal to the semiconductor body 210 is higher than in the second insulating film 222d corresponds to the memory cell MC described in the embodiment.

As shown in FIG. 12A, the charge trapping film 222 may further include at least one other silicon nitride film 222f between the second insulating film 222d and the conductive layer 21, and at least one other silicon oxide film 224d between the second insulating film 222d and the other silicon nitride film 222f. Also, the blocking insulating film 21a may be included between the charge trapping film 222 and the conductive layer 21.

As shown in FIG. 12B, the generalized memory cell MC according to the second example is an example of the generalized memory cell MC according to the first example that further includes a fifth insulating film 223b and a sixth insulating film 223c. The fifth insulating film 223b is provided between the semiconductor body 210 and the first insulating film 223a. The fifth insulating film 223b includes silicon and oxygen and is, for example, a silicon oxide film. The sixth insulating film 223c is provided between the first insulating film 223a and the fifth insulating film 223b. The sixth insulating film 223c includes silicon and nitrogen and is, for example, a silicon nitride film. The value Si:N of the ratio in the sixth insulating film 223c is set to be lower than in the fourth insulating film 222e. Also, the sixth insulating film 223c may include silicon, nitrogen, and oxygen and may be, for example, a silicon oxynitride film. In the case where the sixth insulating film 223c is a silicon oxynitride film, for example, it is possible for the charge trapping efficiency to be even lower than that of the silicon nitride film.

In other words, the generalized memory cell MC according to the second example is an example in which the tunneling insulating film 223 has an ONO structure. The generalized memory cell MC according to the second example also includes at least a six-layer structure of (silicon oxide/silicon nitride/silicon oxide/silicon nitride/silicon oxide/silicon nitride) (called an ONONON structure) between the semiconductor body 210 and the conductive layer 21. The value Si:N of the ratio in the fourth insulating film 222e which is the silicon nitride film second most proximal to the semiconductor body 210 is set to be higher than in the second insulating film 222d.

According to the generalized memory cell MC according to the second example, the first, fifth, and sixth insulating films 223a to 223c can be identified as, for example, the tunneling insulating film 223.

Accordingly, the memory cell MC that includes at least an ONONON structure between the semiconductor body 210 and the conductive layer 21 and in which the value Si:N of the ratio in the fourth insulating film 222e which is the silicon nitride film second most proximal to the semiconductor body 210 is higher than in the second insulating film 222d corresponds to the memory cell MC described in the embodiment.

In the generalized memory cell MC according to the second example as well, the charge trapping film 222 may further include at least one other silicon nitride film 222f and at least one other silicon oxide film 224d. Also, the blocking insulating film 21a may be included between the charge trapping film 222 and the conductive layer 21.

Thus, according to the embodiments, a semiconductor device that includes a memory cell can be provided in which good data retention characteristics are possible.

The embodiments of the invention are described while referring to specific examples and several modifications. However, the embodiments of the invention are not limited to these specific examples and modifications. Also, the embodiments recited above are not the only embodiments of the invention.

One skilled in the art may similarly practice the invention by appropriately selecting specific configurations of components such as the semiconductor substrate 1, the stacked body 2, the columnar portion CL, etc., from known art; and such practice is within the scope of the invention to the extent that similar effects can be obtained.

Any two or more components of the examples may be combined within the extent of technical feasibility and are within the scope of the invention to the extent that the spirit of the invention is included.

All semiconductor devices practicable by an appropriate design modification by one skilled in the art based on the semiconductor devices described above as the embodiments of the invention also are within the scope of the invention to the extent that the spirit of the invention is included.

Various modifications and alterations within the spirit of the invention will be readily apparent to those skilled in the art; and such modifications and alterations also should be seen as being within the scope of the invention.

The embodiments recited above are presented as examples and are not intended to limit the scope of the invention. The novel embodiments recited above may be implemented in other various forms; and various omissions, substitutions, and modifications can be performed without departing from the spirit of the invention. Such embodiments and their modifications are within the scope and spirit of the invention and are included in the invention described in the claims and their equivalents.

What is claimed is:

1. A semiconductor device, comprising:
   a semiconductor layer;
   a first conductive layer;
   a tunneling insulating film provided between the semiconductor layer and the first conductive layer; and
   a charge trapping film provided between the first conductive layer and the tunneling insulating film, the charge trapping film including a first separation layer, a first trapping layer, and a second trapping layer, the first trapping layer being positioned between the tunneling insulating film and the first separation layer, the second trapping layer being positioned between the first conductive layer and the first separation layer, a trapping efficiency of charge in the first trapping layer being higher than a trapping efficiency of charge in the second trapping layer.

2. The device according to claim 1, wherein
   the first trapping layer includes silicon, nitrogen, and an additive, the second trapping layer includes silicon and nitrogen, and the additive is at least one selected from the group consisting of carbon, aluminum, hafnium, zinc, and titanium.

3. The device according to claim 1, wherein the first trapping layer includes a metal compound.

4. The device according to claim 3, wherein the metal compound is at least one selected from the group consisting of a metal oxide, a metal nitride, and a metal oxynitride.

5. The device according to claim 1, wherein a bandgap of the first separation layer is wider than bandgaps of the first trapping layer and the second trapping layer.

6. The device according to claim 1, wherein the first separation layer includes silicon and oxygen.

7. The device according to claim 1, wherein
the charge trapping film further includes:
a second separation layer positioned between the first separation layer and the second trapping layer; and
a third trapping layer positioned between the first separation layer and the second separation layer, and
the trapping efficiency of charge in the first trapping layer is higher than a trapping efficiency of charge in the third trapping layer.

8. The device according to claim 7, wherein the second separation layer includes silicon and oxygen.

9. The device according to claim 1, further comprising:
a second conductive layer; and
an insulating layer provided between the first conductive layer and the second conductive layer,
the semiconductor layer, the tunneling insulating film, and the charge trapping film each extending along a first direction,
the first conductive layer, the insulating layer, and the second conductive layer being arranged in the first direction.

10. A semiconductor device, comprising:
a semiconductor layer;
a first conductive layer;
a tunneling insulating film provided between the semiconductor layer and the first conductive layer; and
a charge trapping film provided between the first conductive layer and the tunneling insulating film, the charge trapping film including a first separation layer, a first trapping layer, and a second trapping layer, the first trapping layer including silicon and nitrogen and being positioned between the tunneling insulating film and the first separation layer, the second trapping layer including silicon and nitrogen and being positioned between the first conductive layer and the first separation layer,
a value Si:N of a ratio of the silicon and the nitrogen in the first trapping layer being higher than the value in the second trapping layer.

11. The device according to claim 10, wherein a peak value of the value Si:N of the ratio of the silicon and the nitrogen in the first trapping layer is in a range not less than 0.77 and not more than 0.9.

12. The device according to claim 10, wherein a peak value of the value Si:N of the ratio of the silicon and the nitrogen exceeds 0.75 in both the first trapping layer and the second trapping layer.

13. The device according to claim 10, wherein a bandgap of the first separation layer is wider than bandgaps of the first trapping layer and the second trapping layer.

14. The device according to claim 10, wherein the first separation layer includes silicon and oxygen.

15. The device according to claim 10, wherein
the charge trapping film further includes:
a second separation layer positioned between the first separation layer and the second trapping layer; and
a third trapping layer including silicon and nitrogen and being positioned between the first separation layer and the second separation layer, and
the value Si:N of the ratio of the silicon and the nitrogen in the first trapping layer is higher than the value in the third trapping layer.

16. The device according to claim 15, wherein the second separation layer includes silicon and oxygen.

17. The device according to claim 10, further comprising:
a second conductive layer; and
an insulating layer provided between the first conductive layer and the second conductive layer,
the semiconductor layer, the tunneling insulating film, and the charge trapping film each extending along a first direction,
the first conductive layer, the insulating layer, and the second conductive layer being arranged in the first direction.

18. A semiconductor device, comprising:
a semiconductor layer;
a conductive layer;
a first insulating film including silicon and oxygen and being provided between the semiconductor layer and the conductive layer;
a second insulating film including silicon and nitrogen and being provided between the conductive layer and the first insulating film;
a third insulating film including silicon and oxygen and being provided between the first insulating film and the second insulating film; and
a fourth insulating film including silicon and nitrogen and being provided between the first insulating film and the third insulating film,
a value Si:N of a ratio of the silicon and the nitrogen in the fourth insulating film being higher than the value in the second insulating film, or the fourth insulating film including silicon, nitrogen, and at least one additive selected from the group consisting of carbon, aluminum, hafnium, zinc, and titanium.

19. The device according to claim 18, further comprising:
a fifth insulating film including silicon and oxygen and being provided between the semiconductor layer and the first insulating film; and
a sixth insulating film including silicon and nitrogen and being provided between the first insulating film and the fifth insulating film.

20. The device according to claim 18, wherein the sixth insulating film further includes oxygen.

* * * * *